United States Patent
Gan et al.

(10) Patent No.: US 11,874,307 B2
(45) Date of Patent: Jan. 16, 2024

(54) SIGNAL DETECTION CIRCUIT

(71) Applicant: REALTEK SEMICONDUCTOR CORP., Hsinchu (TW)

(72) Inventors: Ruei-Ming Gan, Hsinchu (TW); Kuan-Chang Tsung, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 270 days.

(21) Appl. No.: 17/503,452

(22) Filed: Oct. 18, 2021

(65) Prior Publication Data

US 2022/0357374 A1  Nov. 10, 2022

(30) Foreign Application Priority Data

May 6, 2021  (TW) ................................. 110116322

(51) Int. Cl.
*G01R 19/18* (2006.01)
*G06F 1/04* (2006.01)
*H03F 3/45* (2006.01)

(52) U.S. Cl.
CPC .............. *G01R 19/18* (2013.01); *G06F 1/04* (2013.01); *H03F 3/45475* (2013.01)

(58) Field of Classification Search
CPC ......... G01R 19/18; G01R 19/22; G01R 35/00
See application file for complete search history.

(56) References Cited

U.S. PATENT DOCUMENTS 10,615,750 B1 *  4/2020  Gupta ................... H03F 1/0205
2013/0335055 A1 * 12/2013  Ceballos ............. H03F 3/45475
                                                                  323/311

FOREIGN PATENT DOCUMENTS

TW              M605320 U      12/2020

* cited by examiner

*Primary Examiner* — Tung X Nguyen
(74) *Attorney, Agent, or Firm* — Li & Cai Intellectual Property (USA) Office (57) ABSTRACT

A signal detection circuit is provided, and includes an input switch circuit, an amplitude detection circuit, a clock generating circuit, and an integration circuit. The input switch circuit receives a reference voltage and an input voltage and selectively outputs the reference voltage or the input voltage. The amplitude detection circuit detects an output of the input switch circuit to generate an amplitude voltage. The clock generating circuit controls the input switch circuit to alternately enter first and second phases, the input switch circuit is controlled to output the reference voltage in the first phase, and output the input voltage in the second phase. The integration circuit receives the amplitude voltage as an input, and generates an integration voltage corresponding to an accumulation result within a predetermined time interval. The predetermined time interval includes at least one period that cycles between the first phase and the second phase.

14 Claims, 5 Drawing Sheets

SIGNAL DETECTION CIRCUIT

CROSS-REFERENCE TO RELATED PATENT APPLICATION

This application claims the benefit of priority to Taiwan Patent Application No. 110116322, filed on May 6, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a signal detection circuit, and more particularly to a signal detection circuit capable of reducing an influence of process offset.

BACKGROUND OF THE DISCLOSURE

In the existing detection signal circuit, in order to detect a magnitude of a signal to be tested, two independent current paths are often provided, one for the signal to be tested and another for a reference voltage. These signals are filtered into DC voltages by an amplitude detector and then signal amplitudes of the DC voltages are compared through a comparator.

However, in the above-mentioned architecture, when two independent current paths are made, differences in process variation often cause large errors after the signal amplitudes are compared by the comparator.

Therefore, improving a circuit design to reduce the influence of process variation has become one of the important topics in the related art.

SUMMARY OF THE DISCLOSURE

In response to the above-referenced technical inadequacies, the present disclosure provides a signal detection circuit capable of reducing an influence of process variation.

In one aspect, the present disclosure provides a signal detection circuit comprising an input switch circuit, an amplitude detection circuit, a clock generating circuit, and an integration circuit. The input switch circuit is configured to receive a reference voltage and an input voltage, and is controlled by a switching signal group to selectively output the reference voltage or the input voltage. The amplitude detection circuit is configured to detect an output of the input switch circuit to correspondingly generate an amplitude voltage. The clock generating circuit is configured to generate the switching signal group. The switching signal group is used to control the input switch circuit to alternately enter a first phase and a second phase, and the input switch circuit is controlled to output the reference voltage in the first phase, and output the input voltage in the second phase. The integration circuit is configured to receive the amplitude voltage as an input for performing an accumulation, and generate an integration voltage corresponding to an accumulation result within a predetermined time interval. The predetermined time interval comprises at least one period that cycles between the first phase and the second phase.

Therefore, the signal detection circuit provided by the present disclosure uses the input switch circuit to select the input signal and the reference voltage to enter the amplitude detection circuit and the integration circuit in different phases. Due to a shared back-end circuit, the input signal and the reference voltage can experience the same circuit offset. Therefore, it is possible to reduce errors caused by process variation when different paths are used.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
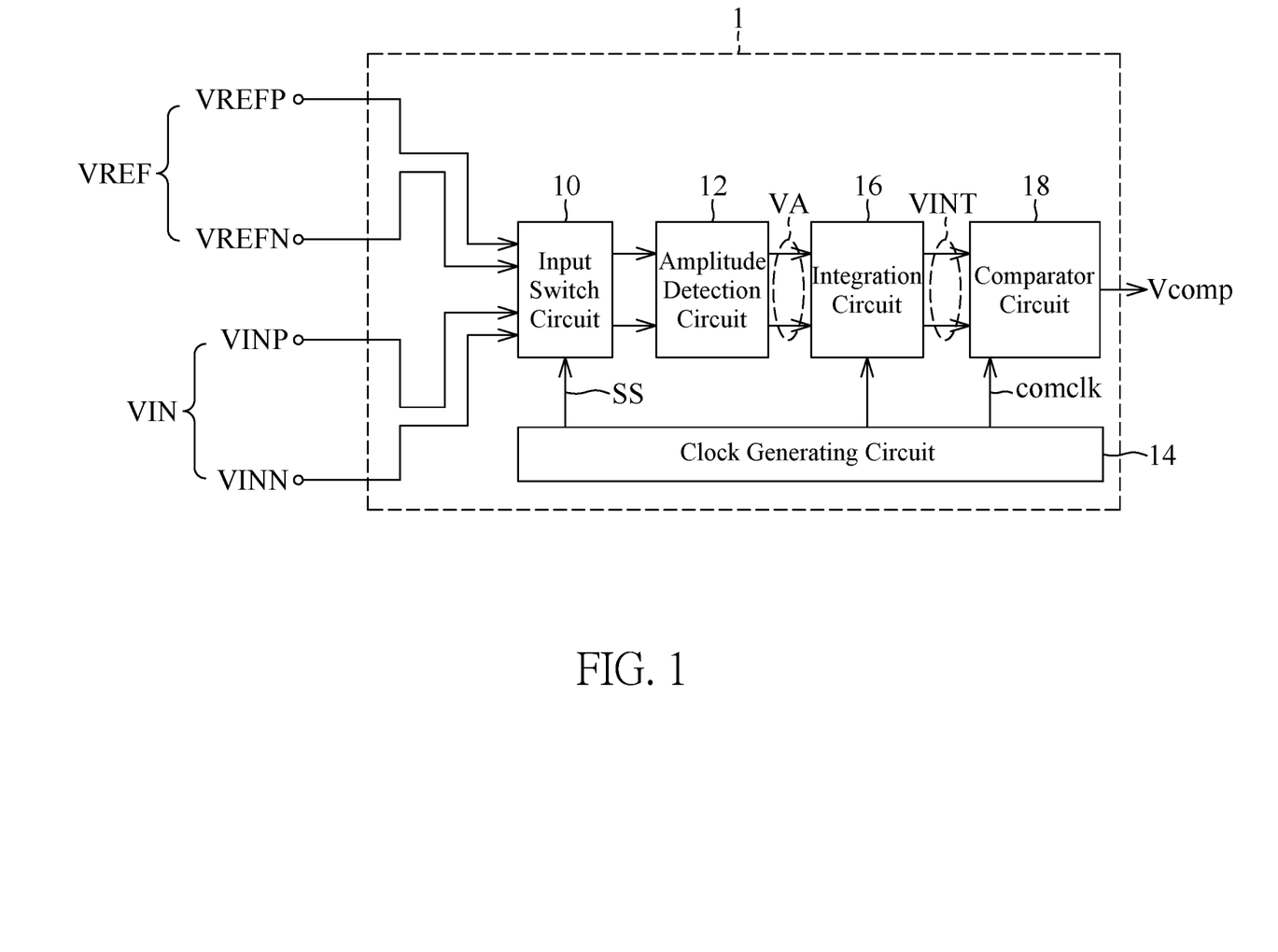
FIG. 1 is a functional block diagram of a signal detection circuit according to an embodiment of the present disclosure.

FIG. 1 is a functional block diagram of a signal detection circuit according to an embodiment of the present disclosure. Referring to FIG. 1, an embodiment of the present disclosure provides a signal detection circuit 1, which includes an input switch circuit 10, an amplitude detection circuit 12, a clock generating circuit 14, and an integration circuit 16.

The input switch circuit 10 is configured to receive a reference voltage VREF and an input voltage VIN, and is controlled by a switching signal group SS to selectively output the reference voltage VREF or the input voltage VIN.

Figure 2:
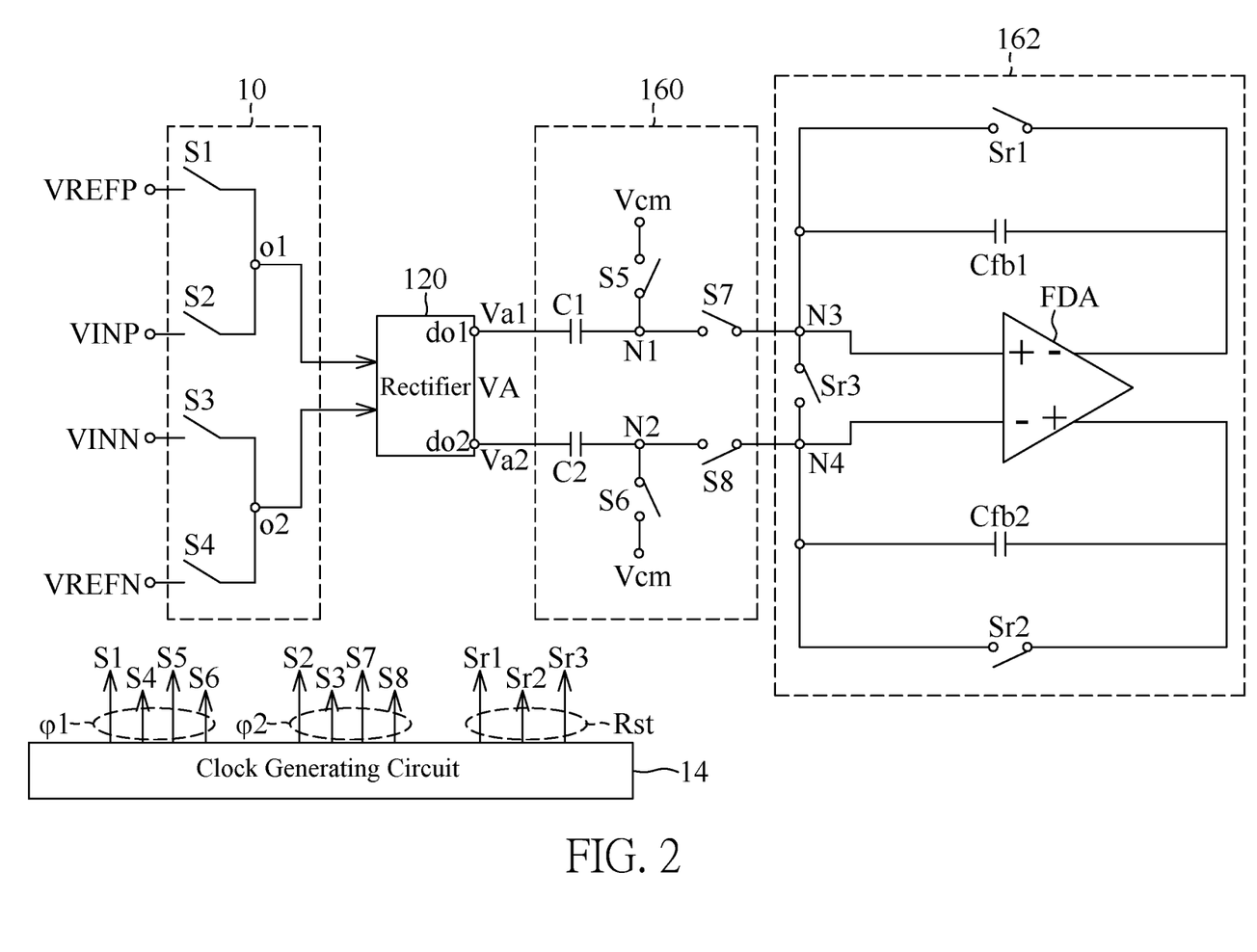
FIG. 2 is a circuit layout of the signal detection circuit according to the embodiment of the present disclosure.

Reference is made to FIG. 2 first, FIG. 2 is a circuit layout diagram of a signal detection circuit according to an embodiment of the present disclosure. For example, the reference voltage VREF is a pair of differential reference voltages including a first reference voltage VREFP and a second reference voltage VREFN, and the input voltage VIN is a pair of differential input voltages including a first input voltage VINP and a second input voltage VINN.

In the embodiment of FIG. 2, in response to that the input voltage VIN is a differential signal, the input switch circuit 10 can be, for example, a multiplexer, and a simplified circuit of the input switch circuit 10 can include a first switch S1, a second switch S2, a third switch S3, and the fourth switch S4 as shown in FIG. 2, and the input switch circuit 10 has a first output terminal o1 and a second output terminal o2. The first switch S1, the second switch S2, the third switch S3, and the fourth switch S4 can be N-type or P-type metal oxide semiconductor field effect transistors (MOSFETs), respectively, but the present disclosure is not limited thereto.

The first switch S1 is connected to the first output terminal o1 and receives the first reference voltage VREFP, the second switch S2 is connected to the first output terminal o1 and receives the first input voltage VINP, the third switch S3 is connected to the second output terminal o2 and receives the second input voltage VINN, and the fourth switch S4 is connected to the second output terminal o2 and receives the second reference voltage VREFN.

Reference is further made to FIG. 1, the amplitude detection circuit 12 is configured to detect an output of the input switch circuit 10 to correspondingly generate an amplitude voltage VA. For example, the amplitude detection circuit 12 can be, for example, a rectifier 120 in FIG. 2, or can be any circuit that can convert the input signal into a pure high or low potential to be output according to a magnitude of the input signal, and the present disclosure is not limited thereto.

As shown in FIG. 2, the rectifier 120 can have a first detection output terminal do1 and a second detection output terminal do2, and is configured to, corresponding to outputs of the first output terminal o1 and the second output terminal o1, generate the amplitude voltage VA including a first amplitude voltage Va1 and a second amplitude voltage Va2 at the first detection output terminal do1 and the second detection output terminal do2, respectively.

On the other hand, the clock generating circuit 14 is used to generate the switching signal group SS (as shown in FIG. 1). The switching signal group SS is mainly used to control the input switch circuit 10 to alternately enter the first phase and the second phase. In detail, the input switch circuit 10 is controlled to output the reference voltage VREF in the first phase, and output the input voltage VIN in the second phase.

In addition, when the above switching method is applied to the embodiment of FIG. 2, the switching signal group SS can include a first switching signal φ1 and a second switching signal φ2, and the first switching signal φ1 is used to control the first switch S1 and the fourth switch S4 to be turned on in the first phase, the second switching signal φ2 is used to control the second switch S2 and the third switch S3 to be turned on in the second phase, such that the input switch circuit 10 outputs the first reference voltage VREFP and the second reference voltage VREFN respectively at the first output terminal o1 and the second output terminal o2 in the first phase, and outputs the first input voltage VINP and the second input voltage VINN respectively at the first output terminal o1 and the second output terminal o2.

Reference is made to FIG. 1 again, the integration circuit 16 is configured to receive the amplitude voltage VA as an input for performing an accumulation, and generate an integration voltage VINT corresponding to an accumulation result within a predetermined time interval. The predetermined time interval includes a plurality of periods that cycle between the first phase and the second phase.

For example, the integration circuit 16 can separately sample the amplitude voltage VA in the first phase (generated according to the reference voltage VREF in this phase) and the amplitude voltage VA in the second phase (generated according to the input voltage VIN in this phase), and perform a subtracting process on the sampled amplitude voltages VA respectively in the first phase and the second phase. Therefore, after the plurality of cycles corresponding to the predetermined time interval have elapsed, it can be determined whether the input voltage VIN is higher or lower than the reference voltage VREF according to the accumulated integration voltage VINT.

In this way, reference can be made to FIG. 2, the integration circuit 16 can include a sampling circuit 160 and an integration amplifier 162. The sampling circuit 160 is configured to sample the first amplitude voltage Va1 and the second amplitude voltage Va2 in the first phase.

As shown in FIG. 2, the sampling circuit 160 can include a first sampling capacitor C1, a second sampling capacitor C2, a fifth switch S5, a sixth switch S6, a seventh switch S7, and an eighth switch S8. The fifth switch S5, the sixth switch S6, the seventh switch S7, and the eighth switch S8 can be N-type or P-type MOSFETs, respectively, but the present disclosure is not limited thereto.

The first sampling capacitor C1 is connected between the first detection output terminal do1 and a first node N1, and the second sampling capacitor C2 is connected between the second detection output terminal do2 and a second node N2. One end of the fifth switch S5 is connected to the first node N1, and another end of the fifth switch S5 receives a common mode voltage Vcm. One end of the sixth switch S6 is connected to the second node N2, and another end of the sixth switch S6 receives the common mode voltage Vcm. The seventh switch S7 is connected between the first node N1 and a third node N3, and the eighth switch S8 is connected between the second node N2 and a fourth node N4.

On the other hand, the integrating amplifier 162 is configured to hold the first amplitude voltage Va1 and the second amplitude voltage Va2 sampled by the sampling circuit 160 in the second stage for performing accumulations, respectively.

Therefore, as shown in FIG. 2, the integrating amplifier 162 can include a fully differential amplifier FDA, a first feedback capacitor Cfb1, and a second feedback capacitor Cfb2.

The fully differential amplifier FDA has a non-inverting input terminal ("+" terminal on the left side), an inverting input terminal ("−" terminal on the left side), an inverting output terminal ("+" terminal on the right side), and a non-inverting output terminal ("−" terminal on the right side). The non-inverting input terminal is connected to the third node N3, and the inverting input terminal is connected to the fourth node N4. The first feedback capacitor Cfb1 is connected between the non-inverting input terminal and the inverting output terminal, and the second feedback capacitor Cfb2 is connected between the inverting input terminal and the non-inverting output terminal.

As shown in FIG. 2, the fifth switch S5 and the sixth switch S6 are controlled by the first switching signal φ1 to be turned on in the first stage and turned off in the second stage. The seventh switch S7 and the eighth switch S8 are controlled by the second switching signal φ2 to be turned on in the second stage and turned off in the first stage. In the embodiment of the present disclosure, the integration circuit 16 can be replaced by a low-pass filter or a capacitor, but the present disclosure is not limited thereto.

Figure 3:
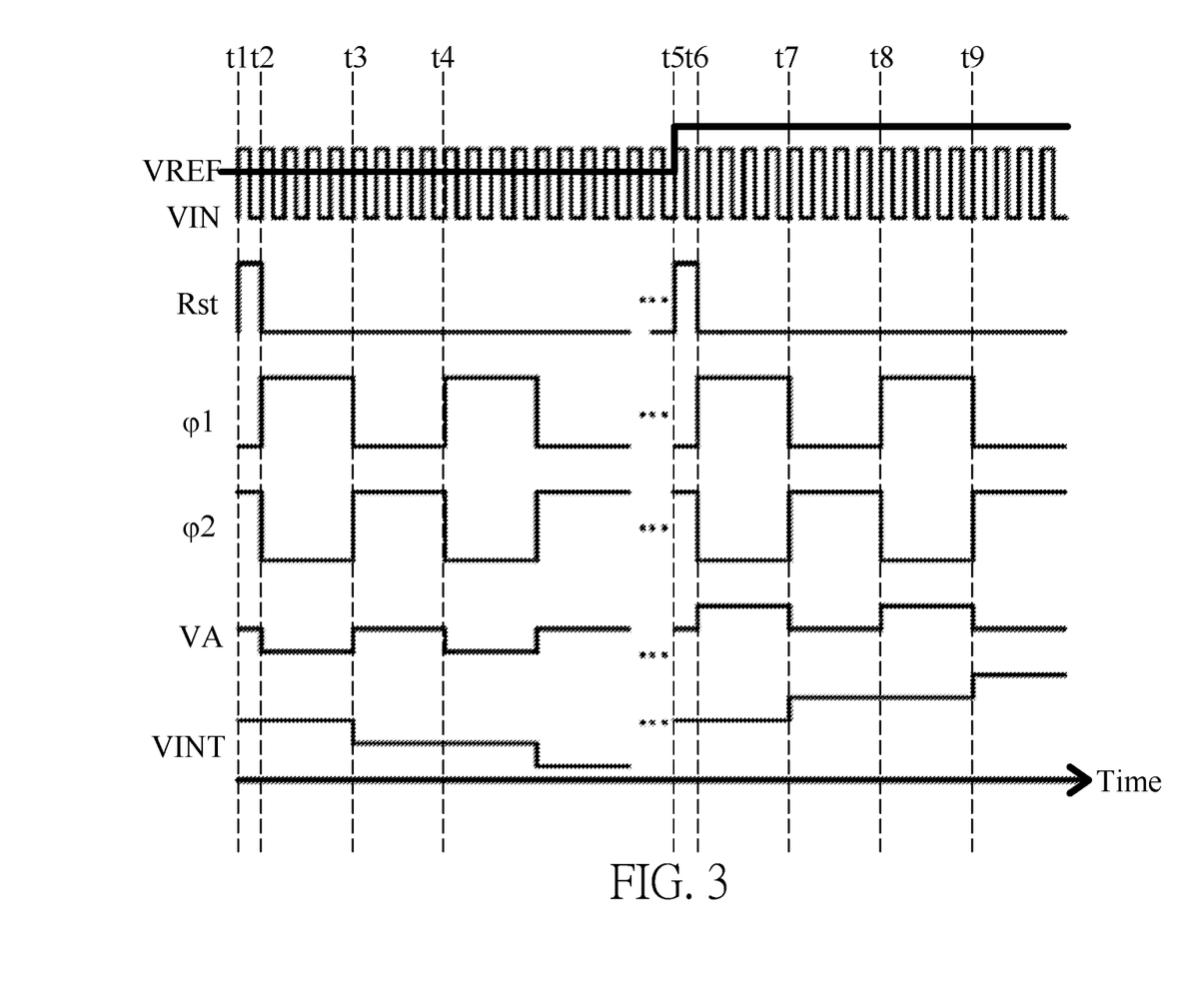
FIG. 3 is a first signal timing diagram of the signal detection circuit according to the embodiment of the present disclosure.

A detection mechanism of the signal detection circuit of FIG. 2 can be described below with reference to FIG. 3. FIG. 3 is a first signal timing diagram of the signal detection circuit according to the embodiment of the present disclosure. As shown in FIG. 3, a timing chart including time point t1-t9 is shown. In the embodiment of FIG. 3, the reference voltage VREF is lower than the input voltage VIN in an interval from time point t1-t5, and is higher than the input voltage VIN in an interval from time point t5-time t9.

In the following, time point t2 is taken as a starting point. The signal detection circuit enters the first phase between time point t2-t3, in which the first switching signal φ1 is at high potential, and the second switching signal φ2 is at low potential. This represents that the first switch S1, the fourth switch S4, the fifth switch S5, and the sixth switch S6 are turned on, and the second switch S2, the third switch S3, the seventh switch S7, and the eighth switch S8 are turned off. At this time, the reference voltage VREF is input to the rectifier 120 to generate the amplitude voltage VA with low potential. For this amplitude voltage VA, the first sampling capacitor C1 samples a difference between the first amplitude voltage Va1 and the common mode voltage Vcm, and the second sampling capacitor C2 samples a difference between the second amplitude voltage Va2 and the common mode voltage Vcm, and thus the amplitude voltage VA can be sampled.

Next, the signal detection circuit enters the second phase between time point t3 and time point t4, in which the first switching signal φ1 is at low potential, and the second switching signal φ2 is at high potential. This represents that the first switch S1, the fourth switch S4, the fifth switch S5, and the sixth switch S6 are turned off, and the second switch S2, the third switch S3, the seventh switch S7, and the eighth switch S8 are turned on. At this time, the input voltage VIN is input to the rectifier 120 to generate the amplitude voltage VA with high potential. This high-potential amplitude voltage VA can be subtracted from the low-potential amplitude voltage VA sampled in the first stage, and a result of the subtraction can be amplified by the fully differential amplifier FDA and held in the first feedback capacitor Cfb1 and the second feedback capacitor Cfb2 to generate the integration voltage VINT.

It can be seen from FIG. 3 that since the reference voltage VREF is lower than the input voltage VIN in the interval from time point t2-t5, the integrated voltage VINT gradually decreases from time point t2-t5. Therefore, after the plurality of periods that cycle between the first phase and the second phase, for example, at time point t5, the integration voltage VINT can be output as the accumulation result to determine a magnitude relationship between the reference voltage VREF and the input voltage VIN.

On the other hand, since the reference voltage VREF is higher than the input voltage VIN in the interval from time point t6-t9, the integration voltage VINT gradually increases from time point t6-t9, and the increased integration voltage VINT can also be output after the plurality of cycles as the accumulation result.

In addition, it is noted that the integrating amplifier 162 of FIG. 2 further includes a first reset switch Sr1, a second reset switch Sr2, and a third reset switch Sr3. The first reset switch Sr1 is connected between the non-inverting input terminal and the inverting output terminal of the fully differential amplifier FDA, the second reset switch Sr2 is connected between the inverting input terminal and the non-inverting output terminal of the fully differential amplifier FDA, and the third reset switch Sr3 is connected between the third node N3 and the fourth node N4.

Correspondingly, the clock generating circuit 14 also generates a reset signal Rst to control the first reset switch Sr1, the second reset switch Sr2, and the third reset switch Sr3 to be turned on within a reset time interval before and after the predetermined time interval, and to be turned off within the predetermined time interval. For example, the reset time interval can be between time point t1-t2 and between time point t5-t6 in FIG. 3, and the predetermined time interval can be, for example, between time point t2-t5. After the first reset switch Sr1, the second reset switch Sr2, and the third reset switch Sr3 are turned on, the held integration voltage VINT can be reset to perform detection again.

Figure 4:
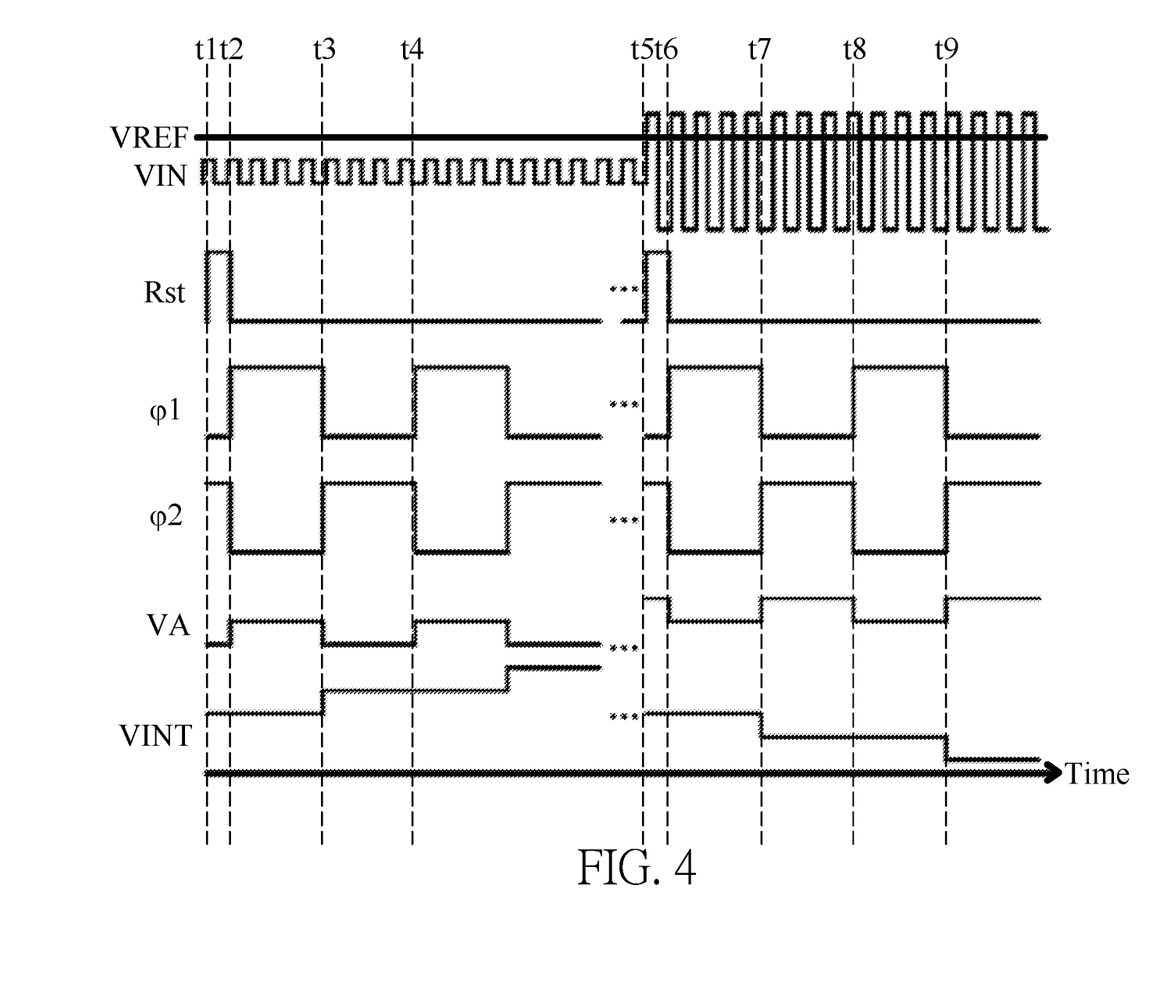
FIG. 4 is a second signal timing diagram of the signal detection circuit according to the embodiment of the present disclosure.

Reference is made to FIG. 4 hereinafter, another example is used to illustrate the detection mechanism of the signal detection circuit of FIG. 2. FIG. 4 is a second signal timing diagram of the signal detection circuit according to the embodiment of the present invention. As shown in FIG. 4, a timing chart including time point t1 to time point t9 is shown. In the embodiment of FIG. 4, the reference voltage VREF is unchanged, and the input voltage is lower than the reference voltage VREF in the interval from time point t1-t5, and is higher than the reference voltage VREF in the interval from time point t5-t9.

In the following, time point t2 is taken as a starting point. The signal detection circuit enters the first phase between time point t2 and time point t3, in which the first switching signal φ1 is at high potential, and the second switching signal φ2 is at low potential. This represents that the first switch S1, the fourth switch S4, the fifth switch S5, and the sixth switch S6 are turned on, and the second switch S2, the third switch S3, the seventh switch S7, and the eighth switch S8 are turned off. At this time, the reference voltage VREF is input to the rectifier 120 to generate the amplitude voltage VA with high potential. For this amplitude voltage VA, the first sampling capacitor C1 samples a difference between the first amplitude voltage Va1 and the common mode voltage Vcm, and the second sampling capacitor C2 samples a difference between the second amplitude voltage Va2 and the common mode voltage Vcm, and thus the amplitude voltage VA can be sampled.

Next, the signal detection circuit enters the second phase between time point t3 and time point t4, in which the first switching signal φ1 is at low potential, and the second switching signal φ2 is at high potential. This represents that the first switch S1, the fourth switch S4, the fifth switch S5, and the sixth switch S6 are turned off, and the second switch S2, the third switch S3, the seventh switch S7, and the eighth switch S8 are turned on. At this time, the input voltage VIN is input to the rectifier 120 to generate the amplitude voltage VA with low potential. This low-potential amplitude voltage VA can be subtracted from the low-potential amplitude voltage VA sampled in the first stage, and a result of the subtraction can be amplified by the fully differential amplifier FDA and held in the first feedback capacitor Cfb1 and the second feedback capacitor Cfb2 to generate the integration voltage VINT.

It can be seen from FIG. 4 that since the reference voltage VREF is higher than the input voltage VIN in the interval from time point t2-t5, the integrated voltage VINT gradually increases from time point t2-5. Therefore, after a plurality of periods that cycle between the first phase and the second phase, for example, at time point t5, the integration voltage VINT can be output as the accumulation result to determine a magnitude relationship between the reference voltage VREF and the input voltage VIN.

Therefore, the above embodiment uses the input switch circuit 10 to select the input signal VIN and the reference voltage VREF to enter the amplitude detection circuit 12 and the integration circuit 16 in different phases. Since a back-end circuit is shared, the input signal VIN and the reference voltage VREF can experience the same circuit offset. Therefore, it is possible to reduce errors caused by process variation when different paths are used.

In some embodiments, the signal detection circuit 1 further optionally includes a comparator circuit 18 configured to receive the integration voltage VINT generated by the integration circuit 16 through a first input terminal and a second input terminal of the comparator circuit 18 (i.e., voltages of the inverting output terminal and the non-inverting output terminal shown in FIG. 2), and the comparator circuit 18 compares the received voltages to generate a comparison result signal Vcomp as the accumulation result. Correspondingly, in this embodiment, the clock generating circuit 14 is also configured to generate a comparison clock signal comclk, so as to control the comparator circuit 18 to generate and output the comparison result signal Vcomp at the end of the predetermined time interval (for example, time point t2-t5 in FIGS. 3 and 4).

Figure 5:
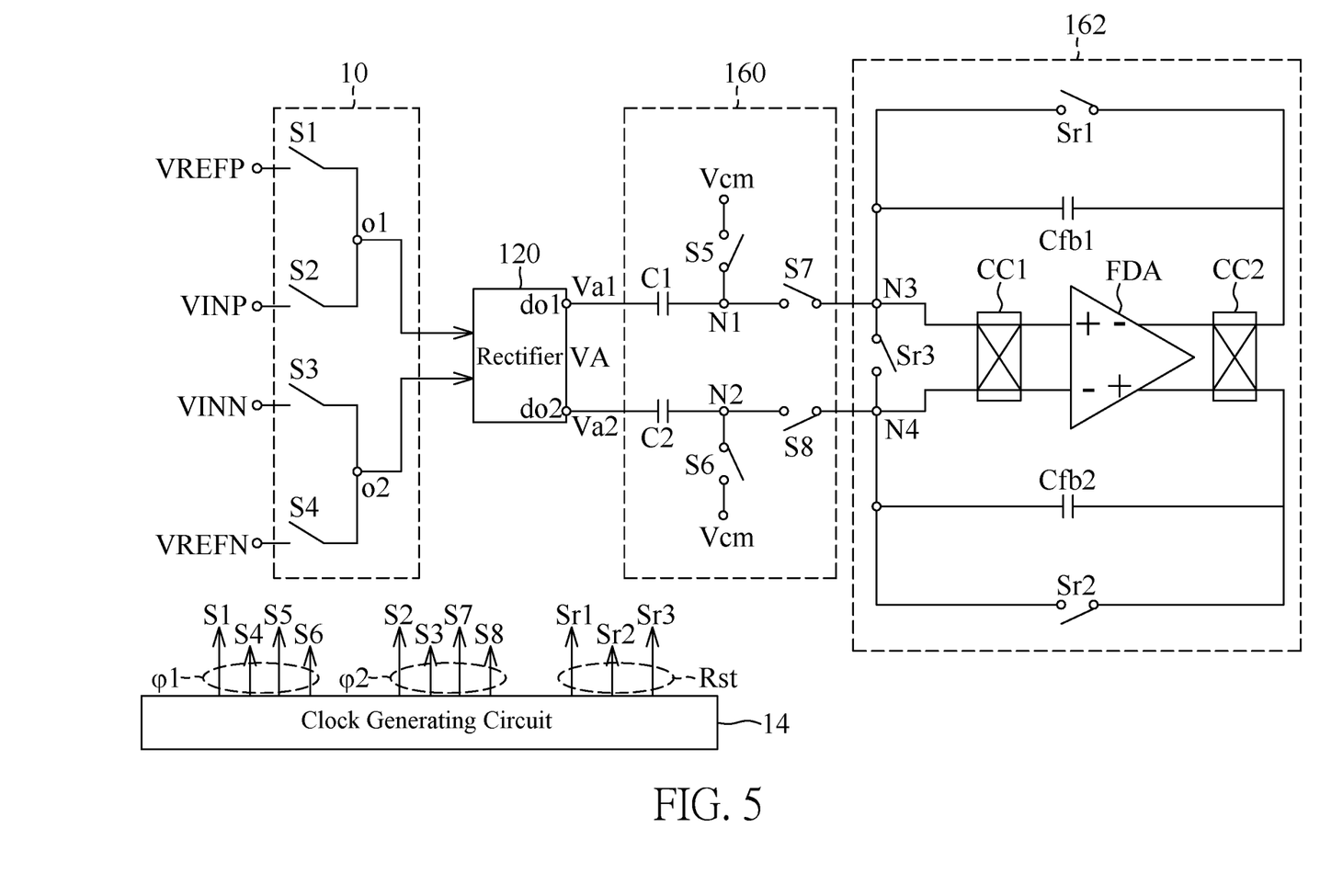
FIG. 5 is a circuit layout of a signal detection circuit according to another embodiment of the present disclosure.

Reference is further made to FIG. 5, which is a circuit layout of a signal detection circuit according to another embodiment of the present disclosure. In another embodiment, the integrating amplifier 162 further optionally includes a chopper circuit, such as a first chopper circuit CC1 and a second chopper circuit CC2 respectively connected to the input terminal and the output terminal of the fully differential amplifier FDA, which can be designed to act at a specific time point. The first chopper circuit CC1 has two input terminals respectively connected to the third node N3 and the fourth node N4, and two output terminals respectively connected to the non-inverting input terminal ("+" terminal on the left side) and the inverting input terminal ("−" terminal on the left side). The second chopper circuit CC2 has two input terminals respectively connected to the inverting output terminal ("−" terminal on the right side) and non-inverting output terminal ("+" terminal on the right side), and two output terminals respectively connected to the first input terminal and the second input terminal of the comparator circuit 18.

For example, the first chopper circuit CC1 and the second chopper circuit CC2 can act together in a predetermined number of cycles, such that the comparator circuit 18 can cancel offsets on the signal transmission paths, thereby optimizing the comparison result signal Vcomp.

For example, the above-mentioned offsets can be offsets generated by the fully differential amplifier FDA, and the predetermined number of cycles can be, for example, 4 cycles. In a first interval of the 4 cycles, for example, in the first two cycles, the first chopper circuit CC1 and the second chopper circuit CC2 can be configured to, according to the first switching signal φ1 and the second switching signal φ2, make the comparator circuit 18 to compare a signal of the inverting output terminal ("−" terminal on the right side) with a signal of the non-inverting output terminal ("+" terminal on the right side). In a second interval of the 4 cycles, for example, in the last two cycles, the first chopper circuit CC1 and the second chopper circuit CC2 are configured to, according to the first switching signal φ1 and the second switching signal φ2, make the comparator circuit 18 to compare the signal of the non-inverting output terminal ("+" terminal on the right side) and the signal of the inverting output terminal ("−" terminal on the right side), thereby achieving an effect of canceling out the offsets of the two output terminals on average, so as to optimize the comparison result signal Vcomp.

In conclusion, the signal detection circuit provided by the present disclosure uses the input switch circuit to select the input signal and the reference voltage to enter the amplitude detection circuit and the integration circuit in different phases. Since the back-end circuit is a shared circuit, the input signal and the reference voltage can experience the same circuit offset. Therefore, it is possible to reduce errors caused by process variation when different paths are used.

In addition, the signal detection circuit provided by the present disclosure can optionally include the comparator circuit and the chopper circuit to achieve the effect of canceling out the offsets of the two output terminals on average, and generate the optimized comparison result signal Vcomp as the accumulation result.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A signal detection circuit, comprising:
an input switch circuit configured to receive a reference voltage and an input voltage, and controlled by a switching signal group to selectively output the reference voltage or the input voltage;
an amplitude detection circuit configured to detect an output of the input switch circuit to correspondingly generate an amplitude voltage;
a clock generating circuit configured to generate the switching signal group, wherein the switching signal group is used to control the input switch circuit to alternately enter a first phase and a second phase, and the input switch circuit is controlled to output the reference voltage in the first phase, and output the input voltage in the second phase;

an integration circuit configured to receive the amplitude voltage as an input for performing an accumulation, and generate an integration voltage corresponding to an accumulation result within a predetermined time interval, wherein the predetermined time interval comprises at least one period that cycles between the first phase and the second phase.

2. The signal detection circuit according to claim 1, wherein the reference voltage is a pair of differential reference voltages comprising a first reference voltage and a second reference voltage, and the input voltage is a pair of differential input voltages comprising a first input voltage and a second input voltage.

3. The signal detection circuit according to claim 2, wherein the input switch circuit has a first output terminal and a second output terminal, the input switch circuit comprising:
   a first switch connected to the first output terminal and receiving the first reference voltage;
   a second switch connected to the first output terminal and receiving the first input voltage;
   a third switch connected to the second output terminal and receiving the second input voltage; and
   a fourth switch connected to the second input terminal and receiving the second reference voltage.

4. The signal detection circuit according to claim 3, wherein the switching signal group comprises a first switching signal and a second switching signal, the first switching signal is used to control the first switch and the fourth switch to be turned on in the first phase, the second switching signal is used to control the second switch and the third switch to be turned on in the second phase, such that the input switch circuit outputs the first reference voltage and the second reference voltage respectively at the first output terminal and the second output terminal in the first phase, and outputs the first input voltage and the second input voltage respectively at the first output terminal and the second output terminal in the second phase.

5. The signal detection circuit according to claim 4, wherein the amplitude detection circuit has a first detection output terminal and a second detection output terminal, and is configured to, corresponding to outputs of the first output terminal and the second output terminal, generate the amplitude voltage comprising a first amplitude voltage and a second amplitude voltage at the first detection output terminal and the second detection output terminal, respectively.

6. The signal detection circuit according to claim 5, wherein the integration circuit comprises:
   a sampling circuit configured to sample the first amplitude voltage and the second amplitude voltage in the first phase; and
   an integrating amplifier configured to hold the first amplitude voltage and the second amplitude voltage sampled by the sampling circuit in the second phase for performing accumulations, respectively.

7. The signal detection circuit according to claim 6, wherein the sampling circuit comprises:
   a first sampling capacitor connected between the first detection output terminal and a first node;
   a second sampling capacitor connected between the second detection output terminal and a second node;
   a fifth switch having one end connected to the first node, and another end receiving a common mode voltage;
   a sixth switch having one end connected to the second node, and another end receiving the common mode voltage;
   a seventh switch connected between the first node and a third node; and
   an eighth switch connected between the second node and a fourth node.

8. The signal detection circuit according to claim 7, wherein the integrating amplifier comprises:
   a fully differential amplifier having a non-inverting input terminal, an inverting input terminal, an inverting output terminal, and a non-inverting output terminal, wherein the non-inverting input terminal is connected to the third node, and the inverting input terminal is connected to the fourth node;
   a first feedback capacitor connected between the non-inverting input terminal and the inverting output terminal; and
   a second feedback capacitor connected between the inverting input terminal and the non-inverting output terminal.

9. The signal detection circuit according to claim 8, wherein the fifth switch and the sixth switch are configured to be controlled by the first switching signal to be turned on in the first phase and turned off in the second phase, and the seventh switch and the eighth switch are configured to be controlled by the second switching signal to be turned on in the second phase and turned off in the first phase.

10. The signal detection circuit according to claim 9, wherein the integrating amplifier further comprises:
    a first reset switch connected between the non-inverting input terminal and the inverting output terminal;
    a second reset switch connected between the inverting input terminal and the non-inverting output terminal; and
    a third reset switch connected between the third node and the fourth node.

11. The signal detection circuit according to claim 10, wherein the clock generating circuit is further configured to generate a reset signal to control the first reset switch, the second reset switch, and the third reset switch to be turned on within a reset time interval before and after the predetermined time interval, and to be turned off within the predetermined time interval.

12. The signal detection circuit according to claim 10, further comprising a comparator circuit configured to receive voltages of the inverted output terminal and the non-inverted output terminal through a first input terminal and a second input terminal of the comparator circuit, respectively, and compare the voltages to generate a comparison result signal as the accumulation result.

13. The signal detection circuit according to claim 12, wherein the clock generating circuit is further configured to generate a comparison clock signal to control the comparator circuit to generate and output the comparison result signal at an end of the predetermined time interval.

14. The signal detection circuit according to claim 12, further comprising:
    a first chopper circuit having two input terminals respectively connected to the third node and the fourth node, and two output terminals respectively connected to the non-inverting input terminal and the inverting input terminal; and
    a second chopper circuit having two input terminals respectively connected to the inverting output terminal and the non-inverting output terminal, and two output terminals respectively connected to the first input terminal and the second input terminal of the comparator circuit, wherein the first chopper circuit and the second chopper circuit are configured to enable the comparator circuit to compare the voltage of the inverting output terminal with the non-inverting output in a first interval within a predetermined number of the at least one cycle, and the first chopper circuit and the second chopper circuit are further configured to enable the comparator circuit to compare the voltage of the non-inverting output terminal with the voltage of the inverting output terminal in a second interval within the predetermined number of the at least one cycle.

\* \* \* \* \*